(12) United States Patent
Zhang et al.

(10) Patent No.: US 9,010,961 B2
(45) Date of Patent: Apr. 21, 2015

(54) LED INTEGRATED PACKAGING LIGHT SOURCE MODULE

(75) Inventors: Haibing Zhang, Shanghai (CN);
Guangming Xu, Shanghai (CN);
Huafeng Yan, Shanghai (CN)

(73) Assignee: Shanghai Yaming Lighting Co., Ltd, Jiading District, Shanghai (CN)

( * ) Notice: Subject to any disclaimer, the term of this patent is extended or adjusted under 35 U.S.C. 154(b) by 170 days.

(21) Appl. No.: 13/811,250

(22) PCT Filed: Nov. 25, 2010

(86) PCT No.: PCT/CN2010/079126
§ 371 (c)(1),
(2), (4) Date: Jan. 18, 2013

(87) PCT Pub. No.: WO2012/009919
PCT Pub. Date: Jan. 26, 2012

(65) Prior Publication Data
US 2013/0114250 A1    May 9, 2013

(30) Foreign Application Priority Data

Jul. 20, 2010 (CN) .......................... 2010 1 0231704

(51) Int. Cl.
| | |
|---|---|
| *F21V 9/16* | (2006.01) |
| *H01L 25/075* | (2006.01) |
| *F21Y 101/02* | (2006.01) |
| *F21Y 105/00* | (2006.01) |
| *F21Y 113/00* | (2006.01) |
| *H01L 33/50* | (2010.01) |
| *H01L 33/60* | (2010.01) |

(52) U.S. Cl.
CPC ......... *H01L 25/0753* (2013.01); *F21Y 2101/02* (2013.01); *F21Y 2105/003* (2013.01); *F21Y 2113/005* (2013.01); *H01L 33/504* (2013.01); *H01L 33/60* (2013.01)

(58) Field of Classification Search
CPC ............ H01L 25/0753; F21Y 2101/02; F21Y 2105/003
USPC ......... 362/231; 257/98; 252/301.4 F, 301.4 H
See application file for complete search history.

(56) References Cited

U.S. PATENT DOCUMENTS

| | | | |
|---|---|---|---|
| 2006/0028122 A1* | 2/2006 | Wang et al. .................... | 313/503 |
| 2008/0106894 A1* | 5/2008 | Kim et al. ..................... | 362/231 |
| 2008/0151143 A1* | 6/2008 | Li et al. ........................... | 349/68 |
| 2009/0323330 A1* | 12/2009 | Gordin et al. ................. | 362/235 |
| 2012/0049213 A1* | 3/2012 | Chen et al. ..................... | 257/89 |

* cited by examiner

*Primary Examiner* — Elmito Breval
(74) *Attorney, Agent, or Firm* — Global IP Services; Tianhua Gu

(57) ABSTRACT

An LED integrated packaging light source module is provided, which includes a substrate, a plurality of bowl-shaped reflective cups is disposed on the substrate, a blue light LED chip or a red-light LED chip is disposed inside each reflective cup, the ratio between the number of the blue light LED chips and the number of the red-light LED chips on the substrate is 2:1, and a mixed colloid of yellow and green fluorescent powders is coated on the blue light LED chip. In the LED integrated packaging light source module, the bowl-shaped reflective cups set on a substrate, on one aspect, enhance the light emission efficiencies of the blue light LED chip and the red-light LED chip, and on another aspect, improve the heat dissipation of the blue light LED chip, so as to prevent the heat generated by the blue light LED chip from affecting the red-light LED chip, thereby enhancing the reliability of the entire integrated packaging light source module.

7 Claims, 3 Drawing Sheets

LED INTEGRATED PACKAGING LIGHT SOURCE MODULE

CROSS REFERENCE TO RELATED PATENT APPLICATION

The present application is the US national stage of PCT/CN2010/079126 filed on Nov. 25, 2010, which claims the priority of the Chinese patent application No. 201010231704.1 filed on Jul. 20, 2010, which application is incorporated herein by reference.

BACKGROUND OF THE PRESENT INVENTION

1. Field of Invention

The present invention relates to a light source module, and specifically to a light-emitting diode (LED) integrated packaging light source module with a low color temperature and a high color rendering property.

2. Description of Related Arts

An LED, with the advantages such as a long lifetime, low power consumption, and being easily driven, has been widely applied in the production and daily lives of people's. In a currently used white-light LED, a blue light LED chip is usually used as an excitation light source to excite a YAG fluorescent powder to obtain yellow light, and the yellow light is then mixed with the rest blue light emitted by the blue light LED chip to obtain a demanded white light. The white light obtained by adopting such a "blue light LED+YAG fluorescent powder" method has high luminous efficacy and a high color rendering property in the case of a high color temperature; however, in the case of a low color temperature, the color rendering index and the luminous efficacy are low, which can hardly meet the requirement of common lighting.

To solve the foregoing problem, a red fluorescent powder is usually added in a yellow fluorescent powder (for example, Patents CN1677695A, CN101414604A, and CN101195742A) to increase the red component in a white-light LED, so as to provide a color rendering index; however, the loss of luminous flux is high in adopting this method, making it unsuitable for practical applications. In another method, a white-light LED and a red-light LED are packaged in one same LED (for example, Patent CN1937222A), and the red light emitted by the red-light LED chip is used to alleviate the disadvantage that the white light lacks red light radiation. However, as AlGaInP system materials are adopted in a current red-light LED chip, the temperature resistance is low, and when the packaging is done near a blue light LED chip, the materials are susceptible to the heat generated by the blue light LED chip, which further affects the stability of the entire packaging module.

SUMMARY OF THE PRESENT INVENTION

In view of the above deficiencies in the prior art, the technical problem to be solved by the present invention is to provide an LED integrated packaging light source module with high stability, desirable heat dissipation, a low color temperature, and a high color rendering property.

To solve the above technical problem, the present invention adopts the following technical solution:

An LED integrated packaging light source module comprises a substrate, a plurality of bowl-shaped reflective cups is disposed on the substrate, a blue light LED chip or a red-light LED chip is disposed inside each reflective cup, the ratio between the number of the blue light LED chips and the number of the red-light LED chips on the substrate is 2:1, and a mixed colloid of yellow and green fluorescent powders is coated on the blue light LED chip.

Optimally, 6 reflective cups are disposed on the substrate, in which 4 reflective cups are disposed with the blue light LED chip and 2 reflective cups are disposed with the red-light LED chip.

Optimally, the peak wavelength of the blue light LED chip is from 440 nm to 480 nm, the peak wavelength of the red-light LED chip is from 600 nm to 670 nm, the excitation wavelength of the yellow fluorescent powder is from 540 nm to 560 nm, and the excitation wavelength of the green fluorescent powder is from 510 nm to 540 nm.

Optimally, the peak wavelength of the blue light LED chip is from 450 nm to 470 nm, and the peak wavelength of the red-light LED chip is from 620 nm to 650 nm.

Optimally, a hemispherical transparent silica gel is packaged on the reflective cup.

Optimally, the substrate is an aluminum substrate, a copper substrate or a ceramic substrate.

Optimally, the weight ratio between the yellow fluorescent powder and the green fluorescent powder in the mixed colloid of yellow and green fluorescent powders is within the range from 5:1 to 3:1.

Optimally, the weight ratio between the yellow fluorescent powder and the green fluorescent powder in the mixed colloid of yellow and green fluorescent powders is 4:1.

Optimally, the power of the blue light LED chip or red-light LED chip is 0.5 W, 1 W, 3 W or 5W.

Optimally, a frosted glass or a PC diffusion plate is installed on the LED integrated packaging light source module.

The above technical solution has the following beneficial effects. The LED integrated packaging light source module generates yellow-green light by exciting a yellow-green fluorescent powder with blue light emitted by a blue light LED chip, and the yellow-green light is then mixed with the rest blue light from the fluorescent powder excited by the blue light LED chip and red light emitted by a red-light LED chip to obtain a white light source with a low color temperature and a high color rendering property. The bowl-shaped reflective cups set on a substrate, on one aspect, enhance the light emission efficiencies of the blue light LED chip and the red-light LED chip, and on another aspect, improve the heat dissipation of the blue light LED chip, so as to prevent the heat generated by the blue light LED chip from affecting the red-light LED chip, thereby enhancing the reliability of the entire integrated packaging light source module.

DETAILED DESCRIPTION OF THE PREFERRED EMBODIMENTS

The preferred embodiments of the present invention are described in detail below with reference to the accompanying drawings.

Figure 1:
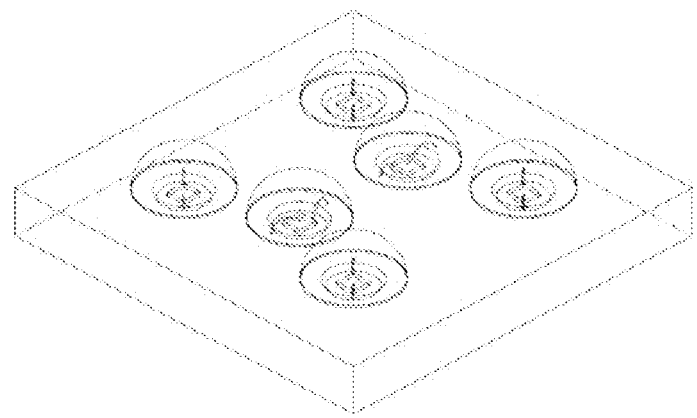
FIG. 1 is a 3D schematic structural view according to an embodiment of the present invention.
Figure 2:
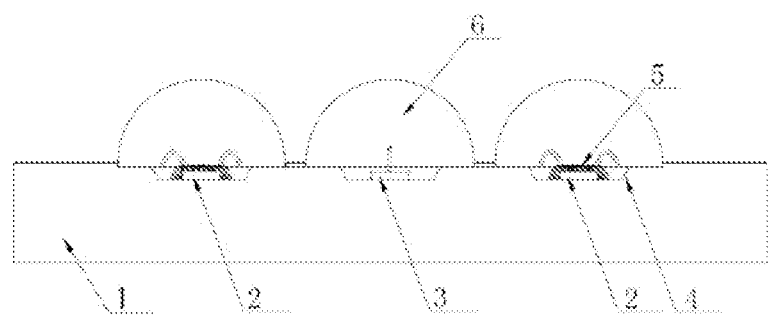
FIG. 2 is a side view according to the embodiment of the present invention.
Figure 3:
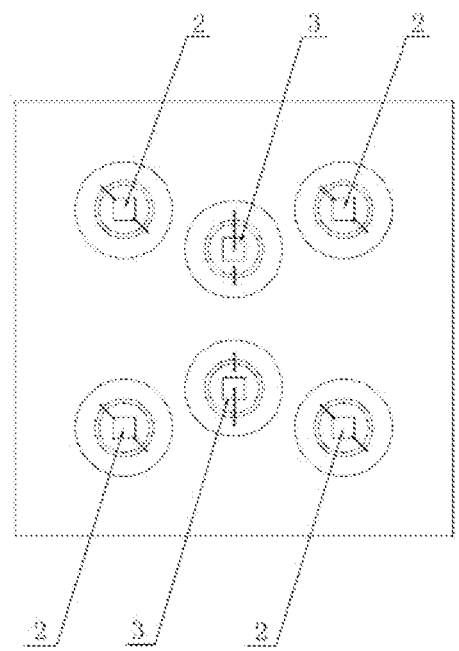
FIG. 3 is a top view according to the embodiment of the present invention.

As shown in FIGS. 1, 2, and 3, the LED integrated packaging light source module includes a substrate 1. The substrate 1 is an aluminum substrate, a copper substrate or a ceramic substrate, as the packaging of these forms of substrates has mature techniques and a low production cost. 6 bowl-shaped reflective cups 4 are disposed on the substrate 1, in which two reflective cups in the middle of the substrate are disposed with a red-light LED chip 3, respectively, and 4 reflective cups are disposed with a blue light LED chip 2, respectively. The 4 reflective cups inside which the blue light LED chip 2 is placed are located at the peripheries of the two reflective cups in which the red-light LED chip 3 is placed, so as to enhance the luminous efficacy of white light and increase the color rendering property thereof. The ratio between the number of the blue light LED chips 2 and the number of the red-light LED chips 3 on the substrate 1 is 2:1. A mixed colloid of yellow and green fluorescent powders 5 is coated on the blue light LED chip 2. In the mixed colloid of yellow and green fluorescent powders 5, the weight ratio between the yellow fluorescent powder and the green fluorescent powder is within the range from 5:1 to 3:1, and optimally the weight ratio is 4:1. The peak wavelength of the blue light LED chip is from 440 nm to 480 nm, and more preferably from 450 nm to 470 nm; the peak wavelength of the red-light LED chip is from 600 nm to 670 nm, and more preferably from 620 nm to 650 nm, the excitation wavelength of the yellow fluorescent powder is from 540 nm to 560 nm, and the excitation wavelength of the green fluorescent powder is from 510 nm to 540 nm.

A hemispherical transparent silica gel 6 is packaged on the reflective cup 4, and the transparent silica gel has a certain formation capability, so as to enhance the light emission efficiency of the blue light LED chip or the red-light LED chip, thereby enhancing the luminous efficacy of the entire LED integrated packaging light source module. The power of the above blue light LED chip or red-light LED chip is 0.5 W, 1 W, 3 W or 5 W. To make it more convenient to fabricate a drive circuit, the blue light LED chip and the red-light LED chip may be driven by the same drive current. For the aspect of circuit connection, a manner of six in series or three in series and two in parallel may be selected, which can be implemented very conveniently.

Figure 4:
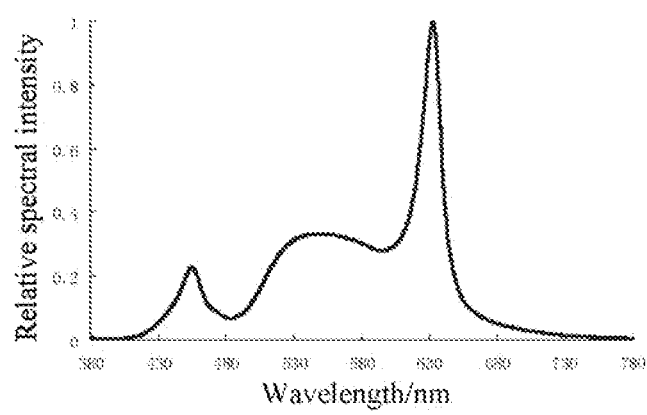
FIG. 4 is a relative spectrogram according to the embodiment of the present invention.

The LED integrated packaging light source module generates yellow-green light by exciting a yellow-green fluorescent powder with blue light emitted by a blue light LED chip, and the yellow-green light is then mixed with the rest blue light from the fluorescent powder excited by the blue light LED chip and red light emitted by a red-light LED chip to obtain a white light source with a low color temperature and a high color rendering property. The relative spectrogram of the LED integrated packaging light source module is shown in FIG. 4, the test data such as luminous flux, a color rendering property, and a color temperature are shown in the following table, respectively:

| Color Temperature (K) | Color Coordinate x/y | Color Rendering Index (Ra) | Luminous Flux (lm) | Luminous Efficacy (lm/W) |
| --- | --- | --- | --- | --- |
| 3120 | 0.433/0.411 | 87 | 471 | 85.6 |

As can be seen from the data in the table, the LED integrated packaging light source module has high luminous efficacy and a desirable color rendering property, which is very suitable for a common lighting source. Also, the bowl-shaped reflective cups on the substrate, on one aspect, enhance the light emission efficiencies of the blue light LED chip and the red-light LED chip, and on another aspect, improve the heat dissipation of the blue light LED chip, so as to prevent the heat generated by the blue light LED chip from affecting the red-light LED chip, thereby enhancing the reliability of the entire integrated packaging light source module. Therefore, the LED integrated packaging light source module is better than an incandescent light bulb and a three-primary-color fluorescent lamp in terms of the color rendering property, lifetime, environmental friendliness, and the like, which is very meaningful for the development of common lighting in the future.

Figure 5:
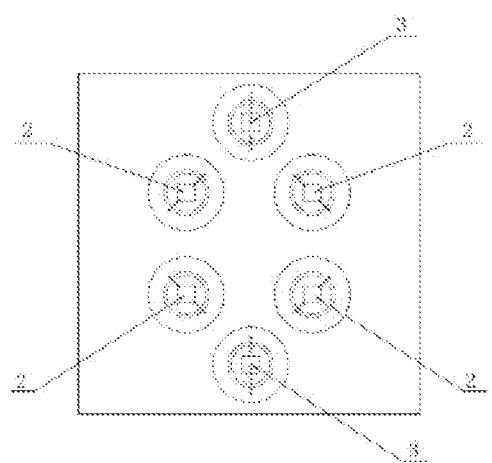
FIG. 5 is a top view according to another embodiment of the present invention.

FIG. 5 shows another embodiment of the present invention. The embodiment and the first embodiment generally have the same structure, and the difference lies in that: 4 blue light LED chips 2 are placed in four reflective cups in the middle of the substrate and 2 red-light LED chips 3 are placed in the reflective cups at the two sides of the substrate. This also effectively enhances the luminous efficacy of white light and increases the color rendering property of white light.

An LED integrated packaging light source module produced by adopting the above embodiments may be used for fabricating a variety of lighting lamps such as a low color temperature cylindrical lamp, a low color temperature ceiling lamp, a low color temperature lighting bulb, and a low color temperature street lamp. During the fabrication of a lighting lamp, to eliminate visual differences and glare due to that different LED chips emit different color light, a frosted glass or a PC diffusion plate may be installed on the LED integrated packaging light source module to achieve the effect of mixing light evenly, so that the lighting lamp has better luminous efficacy and a better color rendering property.

The LED integrated packaging light source module provided in the embodiments of the present invention is illustrated in detail above. Persons of ordinary skill in the art can make variations and modifications to the present invention in terms of the specific implementations and application scopes according to the ideas of the embodiments of the present invention. Therefore, the specification shall not be construed as a limit to the present invention. Any changes made based on the design concepts of the present invention should fall within the protection scope of the invention.

What is claimed is:

1. An LED integrated packaging light source module, comprising a substrate, wherein a plurality of bowl-shaped reflective cups is disposed on the substrate, a blue light LED chip or a red-light LED chip is disposed inside each reflective cup, the ratio between the number of the blue light LED chips and the number of the red-light LED chips on the substrate is 2:1, and a mixed colloid of yellow and green fluorescent powders is coated on the blue light LED chip;

a peak wavelength of the blue light LED chip is from 450 nm to 470 nm, a peak wavelength of the red-light LED chip is from 620 nm to 650 nm, an excitation wavelength of the yellow fluorescent powder is from 540 nm to 560 nm, and an excitation wavelength of the green fluorescent powder is from 510 nm to 540 nm;

the weight ratio between the yellow fluorescent powder and the green fluorescent powder in the mixed colloid of yellow and green fluorescent powders is within the range from 5:1 to 3:1.

2. The LED integrated packaging light source module as in claim 1, wherein 6 reflective cups are disposed on the substrate, 4 reflective cups are disposed with the blue light LED chip, and 2 reflective cups are disposed with the red-light LED chip.

3. The LED integrated packaging light source module as in claim 1, wherein a hemispherical transparent silica gel is packaged on the reflective cup.

4. The LED integrated packaging light source module as in claim 1, wherein the substrate is an aluminum substrate, a copper substrate or a ceramic substrate.

5. The LED integrated packaging light source module as in claim l, wherein the weight ratio between the yellow fluorescent powder and the green fluorescent powder in the mixed colloid of yellow and green fluorescent powders is 4:1.

6. The LED integrated packaging light source module as in claim 1, wherein the power of the blue light LED chip or red-light LED chip is 0.5 W, 1 W, 3 W or 5 W.

7. The LED integrated packaging light source module as in claim 1, wherein a frosted glass or a PC diffusion plate is installed on the LED integrated packaging light source module.

\* \* \* \* \*